US010468612B2

(12) United States Patent
Ito

(10) Patent No.: US 10,468,612 B2
(45) Date of Patent: Nov. 5, 2019

(54) DISPLAY DEVICE

(71) Applicant: Japan Display Inc., Tokyo (JP)

(72) Inventor: Masato Ito, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/939,483

(22) Filed: Mar. 29, 2018

(65) Prior Publication Data
US 2018/0301644 A1    Oct. 18, 2018

(30) Foreign Application Priority Data

Apr. 12, 2017   (JP) .................. 2017-079159

(51) Int. Cl.
| | | |
|---|---|---|
| H01L 51/00 | (2006.01) |
| H01L 51/52 | (2006.01) |
| H01L 27/12 | (2006.01) |
| H01L 27/32 | (2006.01) |
| H01L 51/50 | (2006.01) |

(52) U.S. Cl.
CPC ........ H01L 51/0097 (2013.01); H01L 27/124 (2013.01); H01L 27/1218 (2013.01); H01L 27/1248 (2013.01); H01L 27/1251 (2013.01); H01L 27/322 (2013.01); H01L 27/323 (2013.01); H01L 51/5012 (2013.01); H01L 51/5218 (2013.01); H01L 51/5253 (2013.01); H01L 51/5281 (2013.01); H01L 51/5284 (2013.01); *G02F 2201/123* (2013.01); *H01L 2251/5338* (2013.01)

(58) Field of Classification Search
CPC ............ H01L 51/0097; H01L 51/5281; H01L 51/5284; H01L 27/322; H01L 51/5218; H01L 27/323; H01L 51/5012; H01L 27/124; H01L 27/1251; H01L 51/5253; H01L 2251/5338; G02F 2201/123
USPC ........................................................... 257/40
See application file for complete search history.

(56) References Cited

U.S. PATENT DOCUMENTS

| | | | | |
|---|---|---|---|---|
| 2010/0157213 A1* | 6/2010 | Kubo | ................ | G02F 1/133707 349/114 |
| 2014/0029212 A1* | 1/2014 | Hwang | ................... | G09F 9/301 361/749 |
| 2015/0155505 A1* | 6/2015 | Yamazaki | ........... | H01L 27/3272 257/40 |
| 2015/0198759 A1* | 7/2015 | Chang | .................. | G02B 6/0036 349/12 |
| 2016/0029474 A1 | 1/2016 | Cho et al. | | |
| 2016/0212840 A1* | 7/2016 | Koo | ........................ | G09F 9/301 |

FOREIGN PATENT DOCUMENTS

JP        2016-122206 A        7/2016

* cited by examiner

*Primary Examiner* — Karen Kusumakar
*Assistant Examiner* — Adam S Bowen
(74) *Attorney, Agent, or Firm* — Michael Best & Friedrich LLP

(57) ABSTRACT

A display device includes a display panel and a housing capable of accommodating the display panel. The display panel includes a first display region and a second display region and is flexible. Display in the first display region and display in the second display region are visually recognizable in a first direction in a state where the display panel is taken out from the housing. The display in the second display region is visually recognizable in a second direction opposite to the first direction in a state where the display panel is accommodated in the housing.

16 Claims, 11 Drawing Sheets

DISPLAY DEVICE

CROSS REFERENCE TO RELATED APPLICATIONS

This application is based upon and claims the benefit of priority from the prior Japanese Patent Application No. 2017-079159 filed on Apr. 12, 2017, the entire contents of which are incorporated herein by reference.

FIELD

An embodiment of the present invention relates to a flexible display device.

BACKGROUND

Conventionally, an organic EL (Electroluminescence) display device using an organic electroluminescence (EL) material for a light emitting element (organic EL element) of a display portion is known. Such an organic EL display device is a so-called self-light emitting display device that realizes display by causing the EL material to emit light, unlike a liquid crystal display device or the like.

A display device including a display portion, wires and the like provided on a foldable flexible substrate and thus provides display even when being folded is now a target of attention.

For example, a display device including a display panel that may be rolled in a housing is disclosed (e.g., Japanese Laid-Open Patent Publication No. 2016-122206). When the display device is not in use, the display panel may be rolled in the housing. For using the display device, the display panel is pulled upward from a roller and extended. In this manner, the display device is usable also as an interior ornament.

SUMMARY

A display device in an embodiment according to the present invention includes a display panel that is flexible and a housing capable of accommodating the display panel. The display panel includes a first display region and a second display region. Display in the first display region and display in the second display region are visually recognizable in a first direction in a state where the display panel is taken out from the housing. The display in the second display region is visually recognizable in a second direction opposite to the first direction in a state where the display panel is accommodated in the housing.

A display device in an embodiment according to the present invention includes a flexible display panel and a foldable housing accommodating the display panel. The display panel includes a first display region and a second display region, the display panel being flexible. The housing has an opening. Display in the second display region is visually recognizable through the opening in a state where the housing is folded.

A display device in an embodiment according to the present invention includes a display panel that is flexible and a cylindrical housing capable of accommodating the display panel. The display panel includes a first display region and a second display region, the display panel being flexible. The cylindrical housing has an opening. Display in the second display region is visually recognizable through the opening in a state where the display panel is accommodated in the cylindrical housing.

DESCRIPTION OF EMBODIMENTS

Figure 1:
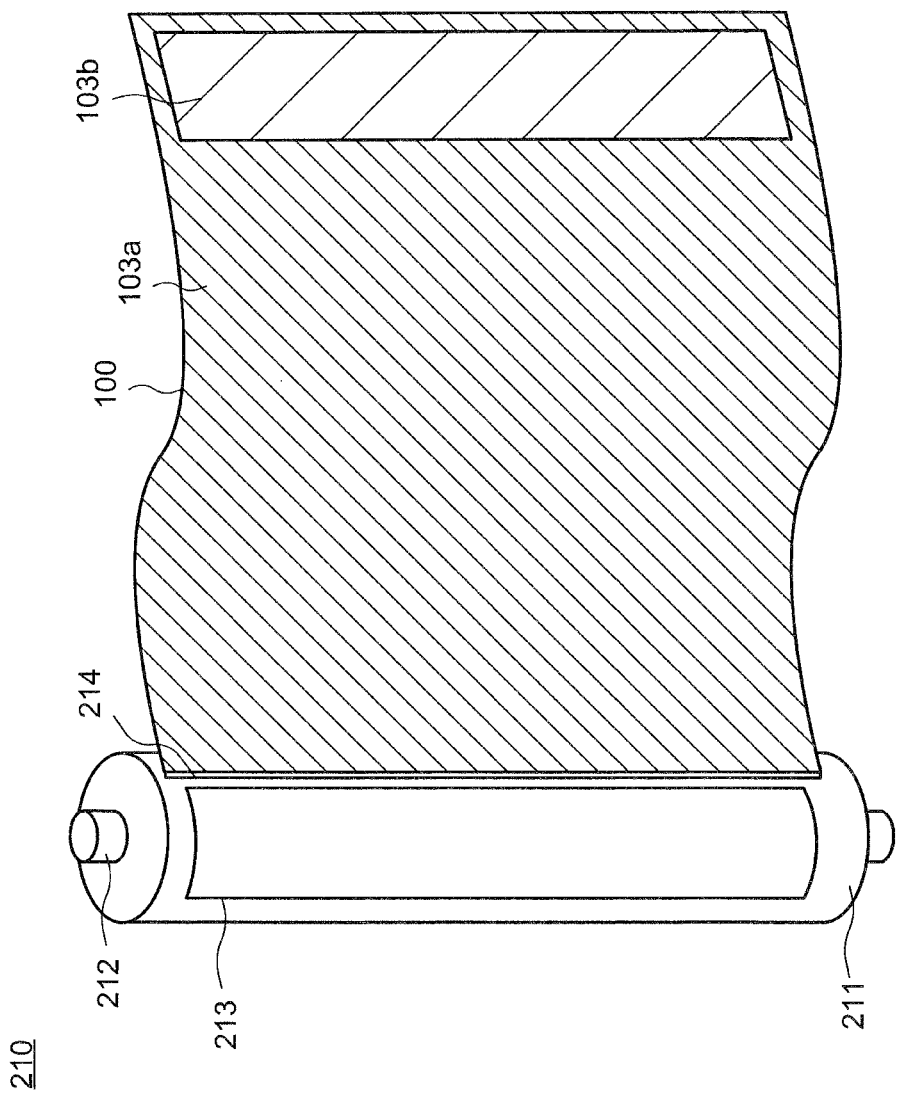
FIG. 1 is a schematic view of a display panel in a display device in an embodiment according to the present invention, showing a state where the display panel is extended out from a housing.

Hereinafter, embodiments of the present invention will be described with reference to the drawings and the like. The present invention may be carried out in various forms without departing from the gist thereof, and is not to be construed as being limited to any of the following embodiments. In the drawings, components may be shown schematically regarding the width, thickness, shape and the like, instead of being shown in accordance with the actual form, for the sake of clear illustration. The schematic drawings merely show examples and do not limit the interpretations of the present invention in any way. In the specification and the drawings, components that are the same as, or similar to, those shown in a previous drawing(s) bear the identical reference signs, and descriptions thereof may not be repeated.

In an embodiment of the present invention, in the case where one certain film is processed to form a plurality of films, such a plurality of films may have different functions or roles. However, the plurality of films are derived from one film formed in the same step as the same layer, and have the same layer structure and are formed of the same material. Therefore, the plurality of films are defined as being present in the same layer.

In the specification and the like, the terms "on", "above", "below" and the like used with reference to the drawings each represent a relative positional relationship between a component of interest and another component. In the specification and the like, a component provided with respect to another component in a direction from an insulating surface (described below) toward a bank is expressed as being provided above the other component, and a component provided with respect to another component in a direction opposite thereto is expressed as being provided below the another component. In the specification and the claims, an expression that a component is "on" another component encompasses a case where such a component is in direct contact with the another component and also a case where such a component is above or below the another component, namely, a case where still another component is provided between such a component and the another component, unless otherwise specified.

In the specification and the like, the terms "first", "second", "third" and the like are merely used to simplify the description and are not to be construed as restricting anything.

First Embodiment

In this embodiment, a display device in an embodiment according to the present invention will be described with reference to FIG. 1 to FIG. 8.

<Display Device 1>

Figure 2:
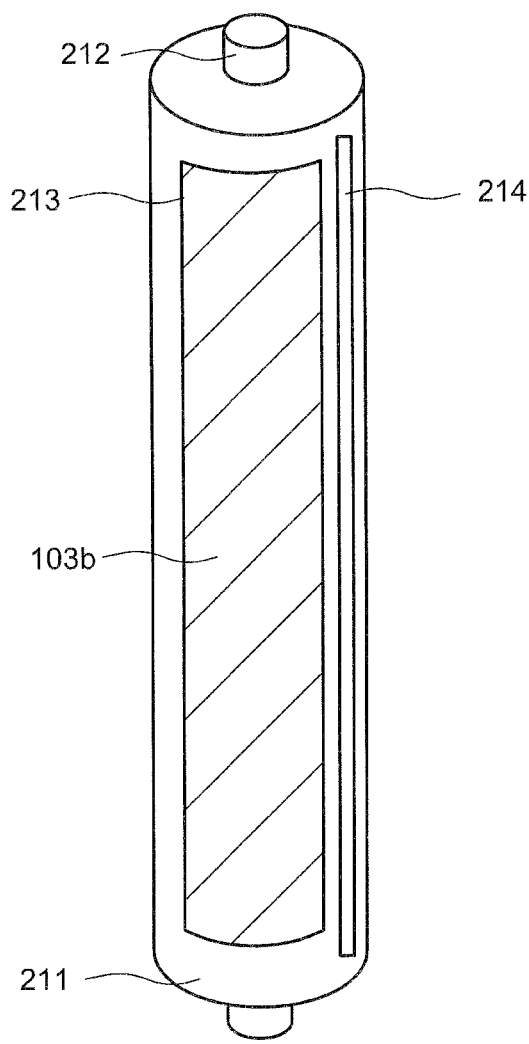
FIG. 2 is a schematic view showing a structure of the display device in an embodiment according to the present invention.

FIG. 1 and FIG. 2 are schematic views showing a structure of a display device 210 in an embodiment according to the present invention. The display device 210 shown in FIG. 1 includes a rollable display panel 100. FIG. 1 shows a state where the display panel 100 is extended. FIG. 2 shows a state where the display panel 100 is accommodated in a cylindrical housing 211 while being partially exposed.

The display device 210 shown in FIG. 1 includes the display panel 100, which is flexible, and the housing 211 capable of accommodating the display panel 100. The housing 211 includes a shaft 212, an opening 213, and a take-out opening 214 through which the display panel 100 is to be taken out. The display panel 212 is rolled around the shaft 212. The opening 213 exposes a part of the display panel 100 in such a rolled state. Through the take-out opening 214, the display panel 100 is taken into, or out of, the housing 211.

The display panel 100 shown in FIG. 1 includes a display region 103a and a display region 103b. In the display device 210 in this embodiment, in the state where the display panel 100 is extended out from the housing 211 as shown in FIG. 1, display in the display region 103a and display in the display region 103b are visually recognizable in a first direction.

In the case where the display panel 100 is accommodated in the housing 211 as shown in FIG. 2, the opening 213 of the housing 211 and the display region 103b positionally match each other. Namely, the opening 213 and the display region 103b overlap each other. In this state, the display region 103b is visually recognizable in a second direction opposite to the first direction (i.e., a surface of the display region 103b that is opposite to the surface visually recognizable in FIG. 1 is visually recognizable). Namely, the display in the display region 103b is visually recognizable in the second direction as well as in the first direction.

The display in the display region 103b is adjustable by the color of the housing 211. For example, in the case where the housing 211 is white (e.g., formed of a white resin), the housing 211 reflects light and thus causes the display to appear bright. In the case where the housing 211 is black (e.g., formed of a black resin), the housing 211 absorbs light and thus improves the contrast.

Conventionally, there is a display device including a rollable display panel or a storable display panel. In the case where such a display device is not in use, the display panel is accommodated in the housing. This prevents the display to be checked. In the case where such a display device is used for a mobile terminal such as a smartphone, a tablet or the like, the display panel needs to be extended out from the housing each time the display is to be checked. This involves a problem of being inconvenient for users.

The display device 210 in an embodiment according to the present invention includes the display region 103a, the display in which is visually recognizable in the first direction, and the display region 103b, the display in which is visually recognizable in the first direction and the second direction opposite to the first direction. Therefore, even in the state where the display panel 100 is accommodated in the housing 211, the display in the display region 103b is visually recognizable in the second direction. Even in the state where the display panel 100 is accommodated in the housing 211, incoming calls or incoming mails, for example, may be checked on the display region 103b. This dispenses with the need to open the housing 211 in order to check incoming calls or incoming mails, which improves the convenience for the users.

Although not shown in FIG. 1 or FIG. 2, it is preferred that the display device 210 includes a polarization plate provided on each of the display region 103a and the display region 103b. For example, a polarization plate may be provided above the display region 103a, and a first polarization plate and a second polarization plate may be provided so as to sandwich the display region 103b. The polarization plate provided above the display region 103a is preferably a circularly polarizing plate. The first polarization plate is provided above the display region 103b and the second polarization plate is provided below the display region 103b. The first polarization plate and the second polarization plate may be provided in a crossed-Nicols state with respect to the display region 103b, so that the image quality in the display region 103b is improved.

Although not shown in FIG. 1 or FIG. 2, the display device 210 may include a touch panel provided on a display screen of the display panel 100. The display device 210 may also include a touch panel provided on a rear surface of the display region 103b. With such an arrangement, even in the state where the display panel 100 is accommodated in the housing 211, the display in the display region 103b may be checked and the touch panel may be operated on the rear surface of the display region 103b. In the case where the polarization plate is provided on the display region 103a and the display region 103b, the touch panel is provided with the polarization plate being located between the touch panel and the display regions 103a and 103b.

<Display Device 2>

Figure 3:
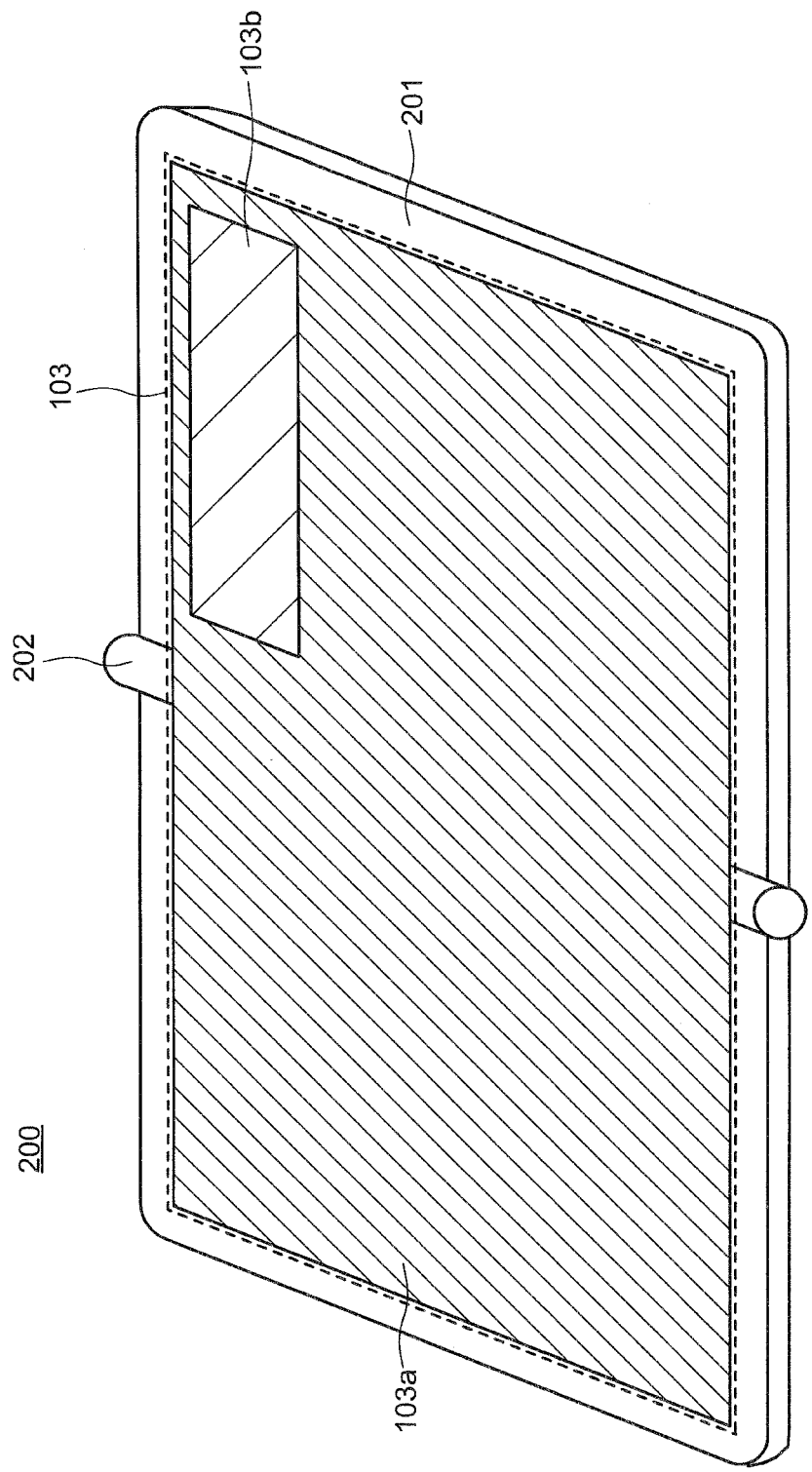
FIG. 3 is a schematic view showing a structure of a display device in an embodiment according to the present invention.
Figure 4:
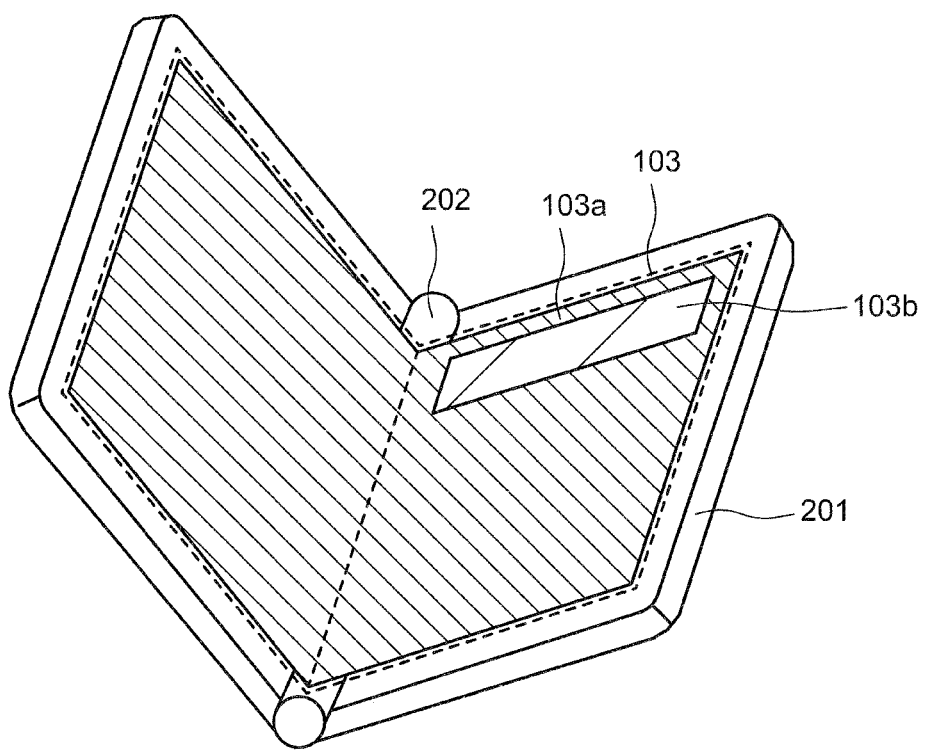
FIG. 4 is a schematic view of the display device in an embodiment according to the present invention, showing a state where the display device is bent.
Figure 5:
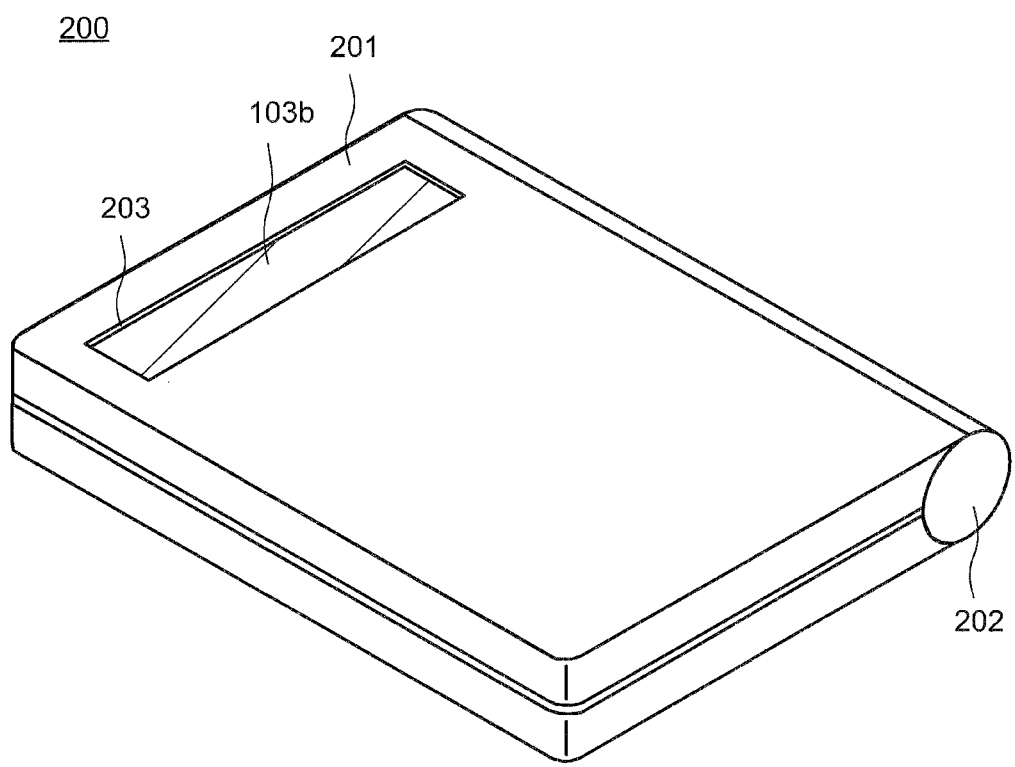
FIG. 5 is a schematic view of the display device in an embodiment according to the present invention, showing a state where the display device is folded into a planar form.

FIG. 3 to FIG. 5 are each a schematic view showing a structure of a display device 200 in an embodiment according to the present invention. In the display device 200 shown in FIG. 3 to FIG. 5, the display panel 100 is foldable together with a housing 201. FIG. 3 shows a state where the display panel 100 is opened and extended flat together with the housing 201. FIG. 4 shows a state where the display panel 100 is bent together with the housing 201. FIG. 5 shows a state where the display panel 100 is folded into a planar form together with the housing 201. In this specification, the state where the display panel is folded into a planar form as shown in FIG. 5 is expressed as a "folded state".

The display device 200 shown in FIG. 3 includes the flexible display panel 100 and the housing 201 capable of accommodating the display panel 100. The housing 201 includes a hinge 202 and an opening 203 shown in FIG. 5.

The hinge 202 allows the housing 201 to be bent or folded. The opening 203 exposes a part of the display panel 100 in a folded state. Provision of the hinge 202 in the housing 201 makes it easy to bend the display device 200. In the case where the housing 201 has a certain level of flexibility, the hinge 202 may not be needed.

The display panel 100 shown in FIG. 3 includes the display region 103a and the display region 103b. In the display device 200 in this embodiment, in the state where the display panel 100 is opened and extended flat together with the housing 201 as shown in FIG. 3, display in the display region 103a and display in the display region 103b are visually recognizable in the first direction.

The housing 201 may include an open/close sensor. In this case, the display region 103b is controlled to be visually recognizable in the first direction when the open/close sensor senses that the housing 201 is opened to be bent or extended flat. The display region 103b is controlled to be visually recognizable in the second direction when the open/close sensor senses that the housing 201 is closed, namely, folded.

This will be described more specifically. In the state where the housing 201 is folded as shown in FIG. 5, the opening 203 of the housing 201 and the display region 103b positionally match each other. In this state, the display in the display region 103b is visually recognizable in the second direction opposite to the first direction. Namely, the display region 103b is visually recognizable in the second direction as well as in the first direction.

The display in the display region 103b is adjustable by the color of the housing 201. For example, in the case where the housing 201 is white (e.g., formed of a white resin), the housing 201 reflects light and thus causes the display to appear bright. In the case where the housing 201 is black (e.g., formed of a black resin), the housing 201 absorbs light and thus improves the contrast.

The display device 200 in an embodiment according to the present invention includes the display region 103a, the display in which is visually recognizable in the first direction, and the display region 103b, the display in which is visually recognizable in the first direction and the second direction opposite to the first direction. Therefore, even in the state where the display panel 100 is folded, the display in the display region 103b is visually recognizable in the second direction. Even in the state where the display panel 100 is folded, incoming calls or incoming mails, for example, may be checked on the display region 103b. This dispenses with the need to open the housing 201 in order to check incoming calls or incoming mails, which improves the convenience for the users.

Although not shown in any of FIG. 3 to FIG. 5, it is preferred that the display device 200 includes a polarization plate on each of the display region 103a and the display region 103b. For example, a polarization plate may be provided above the display region 103a, and a first polarization plate and a second polarization plate may be provided so as to sandwich the display region 103b. The polarization plate provided above the display region 103a is preferably a circularly polarizing plate. The first polarization plate is provided above the display region 103b and the second polarization plate is provided below the display region 103b. The first polarization plate and the second polarization plate may be provided in a crossed-Nicols state with respect to the display region 103b, so that the image quality in the display region 103b is improved.

Although not shown in any of FIG. 3 to FIG. 5, the display device 200 may include a touch panel provided on a screen of the display panel 100. The display device 200 may also include a touch panel provided on the rear surface of the display region 103b. With such an arrangement, even in the state where the display panel 100 is folded, the display in the display region 103b may be checked and the touch panel may be operated on the rear surface of the display region 103b. In the case where the polarization plate is provided on the display region 103a and the display region 103b, the touch panel is provided with the polarization plate being located between the touch panel and the display regions 103a and 103b.

Figure 6:
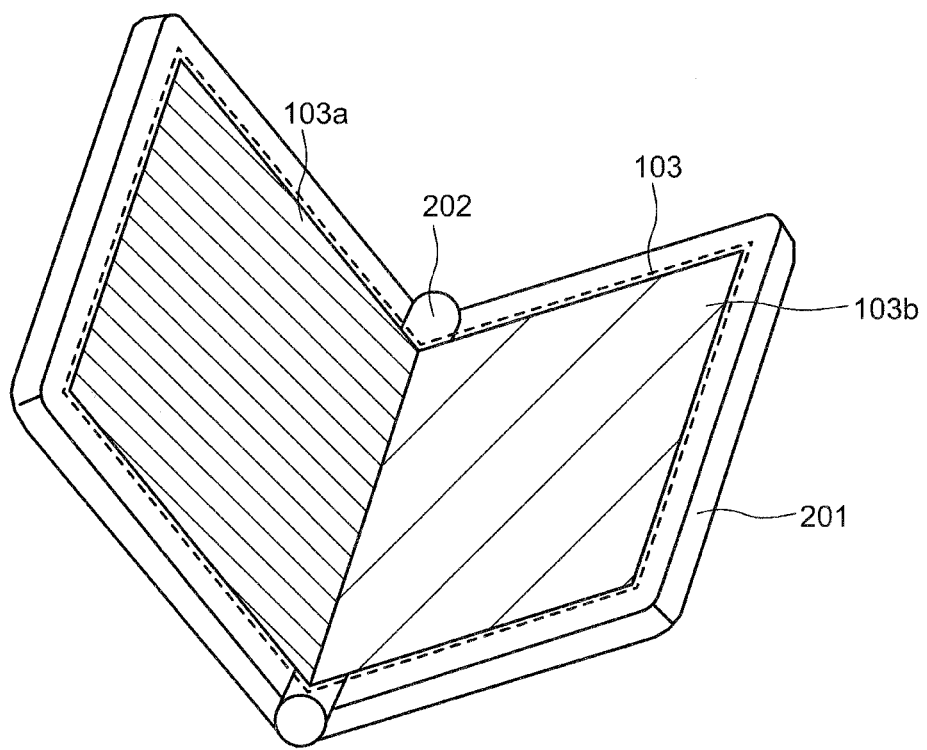
FIG. 6 is a schematic view showing a structure of the display device in an embodiment according to the present invention.

As shown in FIG. 6, a display region 103 may include the display region 103a and the display region 103b with the same area size. In the case where the display device 200 is used as being opened and extended flat, the rear surface of the display region 103b may be covered with a cover member. This improves the contrast, and thus improves the visual recognizability, in the display region 103b.

<Display Device 3>

Figure 7:
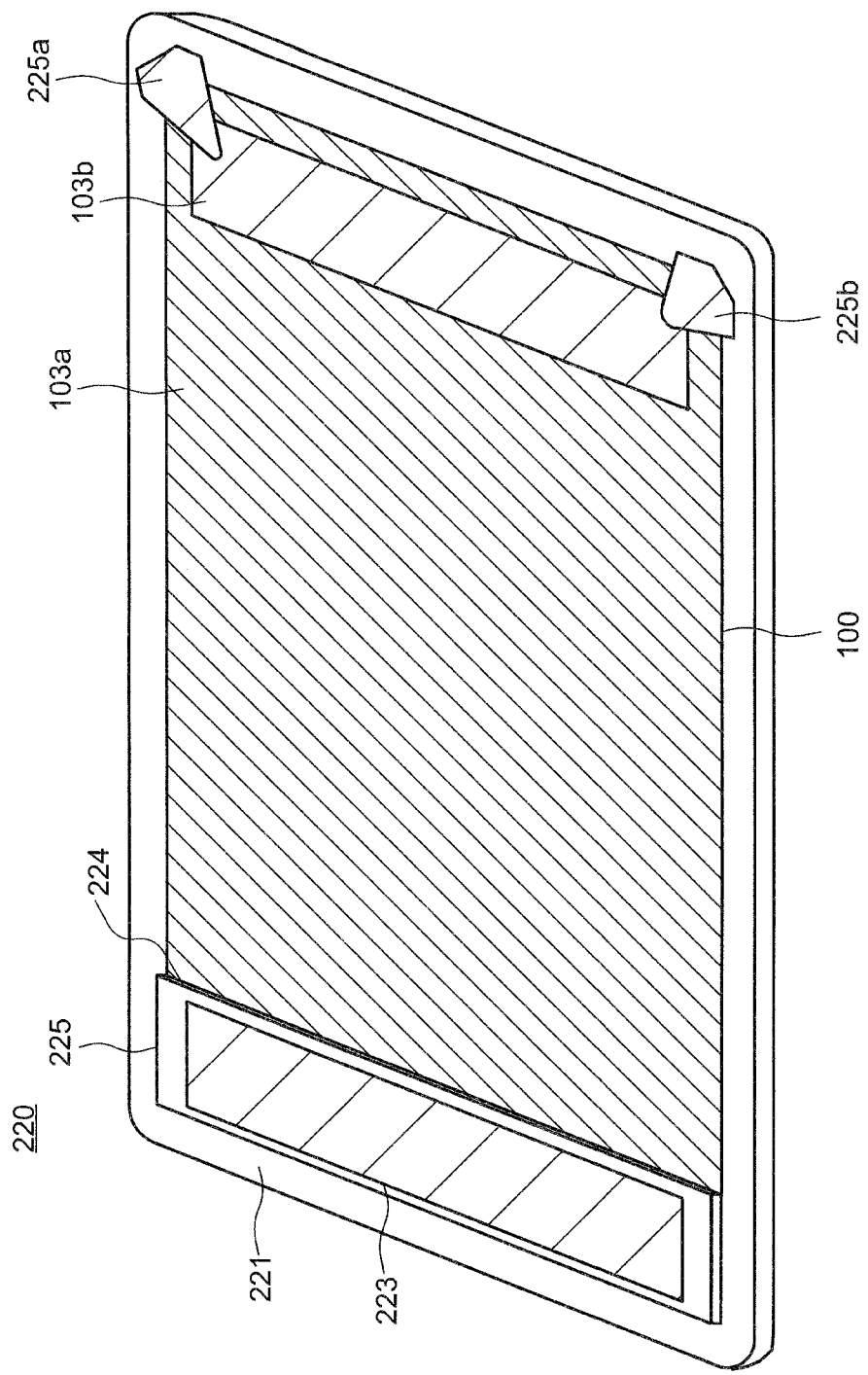
FIG. 7 is a schematic view of a display panel in a display device in an embodiment according to the present invention, showing a state where the display panel is extended out from a housing.
Figure 8:
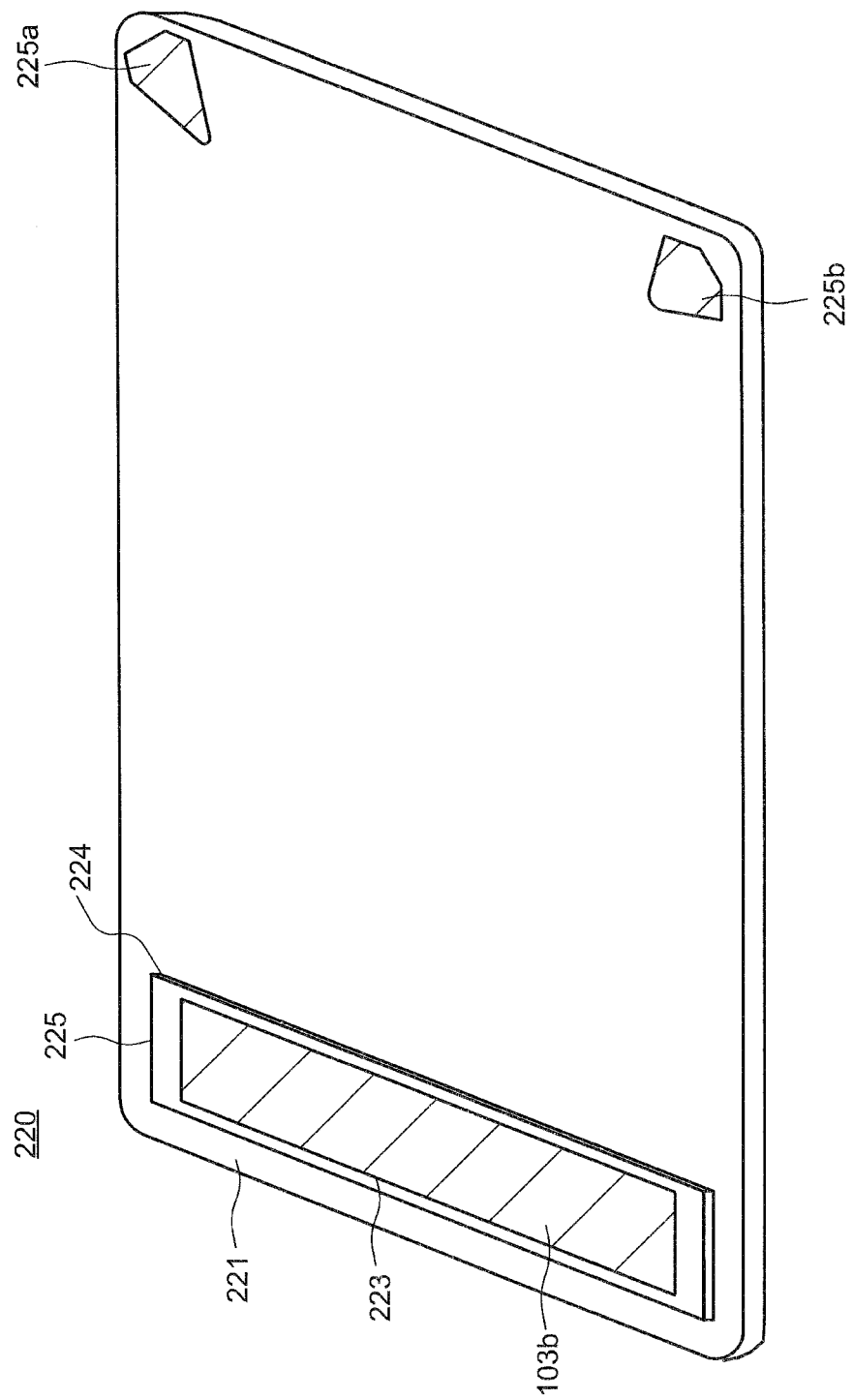
FIG. 8 is a schematic view showing a structure of the display device in an embodiment according to the present invention.

FIG. 7 and FIG. 8 are each a schematic view showing a structure of a display device 220 in an embodiment according to the present invention. The display device 220 shown in FIG. 7 and FIG. 8 is usable as a clip board. The display panel 100 in the display device 220 may be accommodated in a housing 221. FIG. 7 shows a state where the display panel 100 is opened, namely, taken outside and exposed. FIG. 8 shows a state where the display panel 100 is accommodated in the housing 221.

The display device 220 shown in FIG. 7 includes the flexible display panel 100 and the housing 221 capable of accommodating the display panel 100. The housing 221 includes an accommodation portion 225, an opening 223, and a take-out opening 224. The accommodation portion 225 accommodates the display panel 100. The opening 223 exposes a part of the display panel 100 in the accommodated state. Through the take-out opening 224, the display panel 100 is taken into, and out of, the housing 221. The housing 221 includes a clip 225a and a clip 225b, which secures the display panel 100 in the exposed state.

The display panel 100 shown in FIG. 7 includes the display region 103a and the display region 103b. In the display device 220 in this embodiment, in the state where the display panel 100 is exposed from the accommodation portion 225 as shown in FIG. 7, the display region 103a and the display region 103b are visually recognizable in the first direction.

As shown in FIG. 8, in the state where the display panel 100 is accommodated in the accommodation portion 225, the opening 223 formed in the accommodation portion 225 and the display region 103b positionally match each other. In this state, display in the display region 103b is visually recognizable in the second direction opposite to the first direction. Namely, the display in the display region 103b is visually recognizable in the second direction as well as in the first direction.

The display in the display region 103b is adjustable by the color of the housing 221. For example, in the case where the housing 221 is white (e.g., formed of a white resin), the housing 221 reflects light and thus causes the display to appear bright. In the case where the housing 221 is black (e.g., formed of a black resin), the housing 221 absorbs light and thus improves the contrast.

The display device 220 in an embodiment according to the present invention includes the display region 103a, the display in which is visually recognizable in the first direction, and the display region 103b, the display in which is visually recognizable in the first direction and the second direction opposite to the first direction. Therefore, even in the state where the display panel 100 is accommodated in the housing 211, the display in the display region 103b is visually recognizable in the second direction. Even in the state where the display panel 100 is accommodated in the housing 211, incoming calls or incoming mails, for example, may be checked on the display region 103b. This dispenses with the need to open the housing 211 in order to check incoming calls or incoming mails, which improves the convenience for the users.

Although not shown in FIG. 7 or FIG. 8, it is preferred that the display device 220 includes a polarization plate provided on each of the display region 103a and the display region 103b. For example, a polarization plate may be provided above the display region 103a, and a first polarization plate and a second polarization plate may be provided so as to sandwich the display region 103b. The polarization plate provided above the display region 103a is preferably a circularly polarizing plate. The first polarization plate is provided above the display region 103b and the second polarization plate is provided below the display region 103b. The first polarization plate and the second polarization plate may be provided in a crossed-Nicols state with respect to the display region 103b, so that the image quality in the display region 103b is improved.

Although not shown in FIG. 7 or FIG. 8, the display device 220 may include a touch panel provided on the display screen of the display panel 100. The display device 220 may also include a touch panel provided on the rear surface of the display region 103b. With such an arrangement, even in the state where the display panel 100 is accommodated in the accommodation portion 225, the display in the display region 103b may be checked and the touch panel may be operated on the rear surface of the display region 103b. In the case where the polarization plate is provided on the display region 103a and the display region 103b, the touch panel is provided with the polarization plate being located between the touch panel and the display regions 103a and 103b.

Second Embodiment

Figure 9:
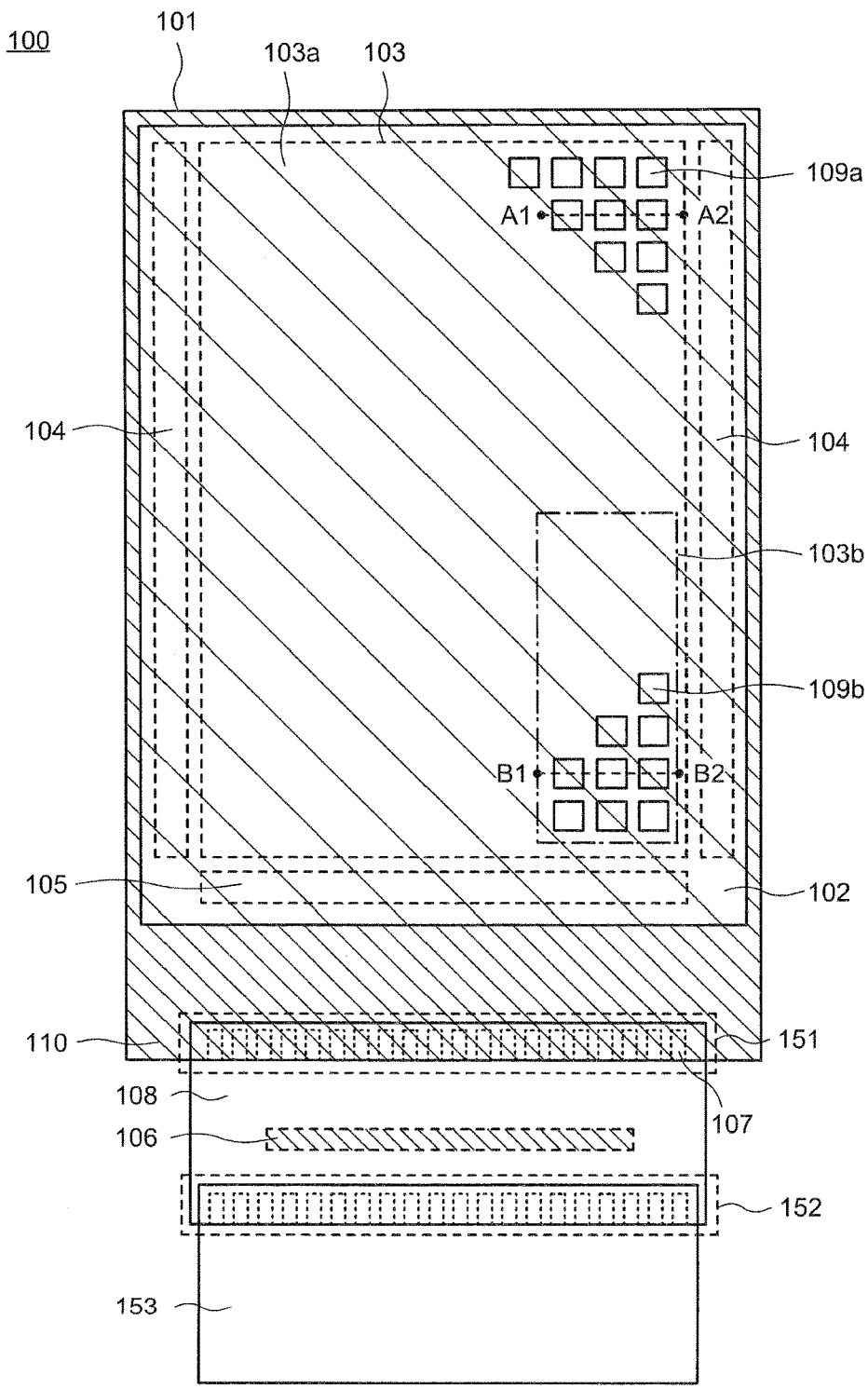
FIG. 9 is a schematic view of a display device in an embodiment according to the present invention as seen in a plan view.

FIG. 9 is a schematic view showing a structure of the flexible display panel 100 in an embodiment according to the present invention. FIG. 9 is a schematic structure of the display panel 100 as seen in a plan view. In the specification and the like, a state where the display panel 100 is seen in a direction perpendicular to the display screen (display region) thereof is expressed as "seen in a plan view".

As shown in FIG. 9, the display panel 100 includes the display region 103 formed on an insulating surface (described below), a scanning line driving circuit 104, a data line driving circuit 105, and a driver IC 106. The driver IC 106 acts as a control portion that supplies a signal to each of the scanning line driving circuit 104 and the data line driving circuit 105. The data line driving circuit 105 may be incorporated into the driver IC 106. The driver IC 106 is mounted on a flexible printed circuit 108 by a COP (Chip on Plastic) technology, namely, provided outer to a substrate 101. Alternatively, the driver IC 106 may be provided on the substrate 101. In FIG. 9, the driver IC 106 is provided on a rear surface of the flexible printed circuit 108. The flexible printed circuit 108 is connected with terminals 107 provided in a peripheral region 110. The flexible printed circuit 108 is connected with an FPC (Flexible Printed Circuit) 153 via a terminal portion 152.

The above-mentioned insulating surface is a top surface of the substrate 101. The substrate 101 supports layers that are provided on the front surface thereof and include transistors, light emitting elements and the like. In this embodiment, the substrate 101 is flexible. The substrate 101 may be formed of an organic resin material such as polyimide, acrylic resin, epoxy, polyethylene terephthalate or the like. It is preferred that the substrate 101 is formed of a light-transmissive material.

The display region 103 shown in FIG. 9 includes a plurality of pixels 109 located in a matrix. Each of the plurality of pixels 109 includes a pixel electrode (described below) and a light emitting element. The light emitting element includes a portion of the pixel electrode (i.e., anode), an organic layer including a light emitting layer stacked on the pixel electrode (i.e., light emitting portion), and a cathode. Each of the pixels 109 is supplied with a data signal corresponding to image data from the data line driving circuit 105. The transistors each electrically connected with the pixel electrode provided in the corresponding pixel 109 are driven in accordance with the data signal, and thus display in accordance with the image data is provided on the display screen. The transistors may be, typically, thin film transistors (TFT). The transistors are not limited to being thin film transistors and may be any elements having an electric current control function.

The display region 103 shown in FIG. 3 includes the display region 103a and the display region 103b. The display region 103a includes a plurality of pixels 109a, among the plurality of pixels 109. The display region 103b includes a plurality of pixels 109b, among the plurality of pixels 109. The pixel electrode of the light emitting element included in each of the pixels 109a located in the display region 103a has a function of reflecting light, whereas the pixel electrode of the light emitting element included in each of the pixels 109b located in the display region 103b has a function of transmitting light. In this example, the display region 103a has a larger area size than that of the display region 103b.

<Pixel Structure>

Figure 10:
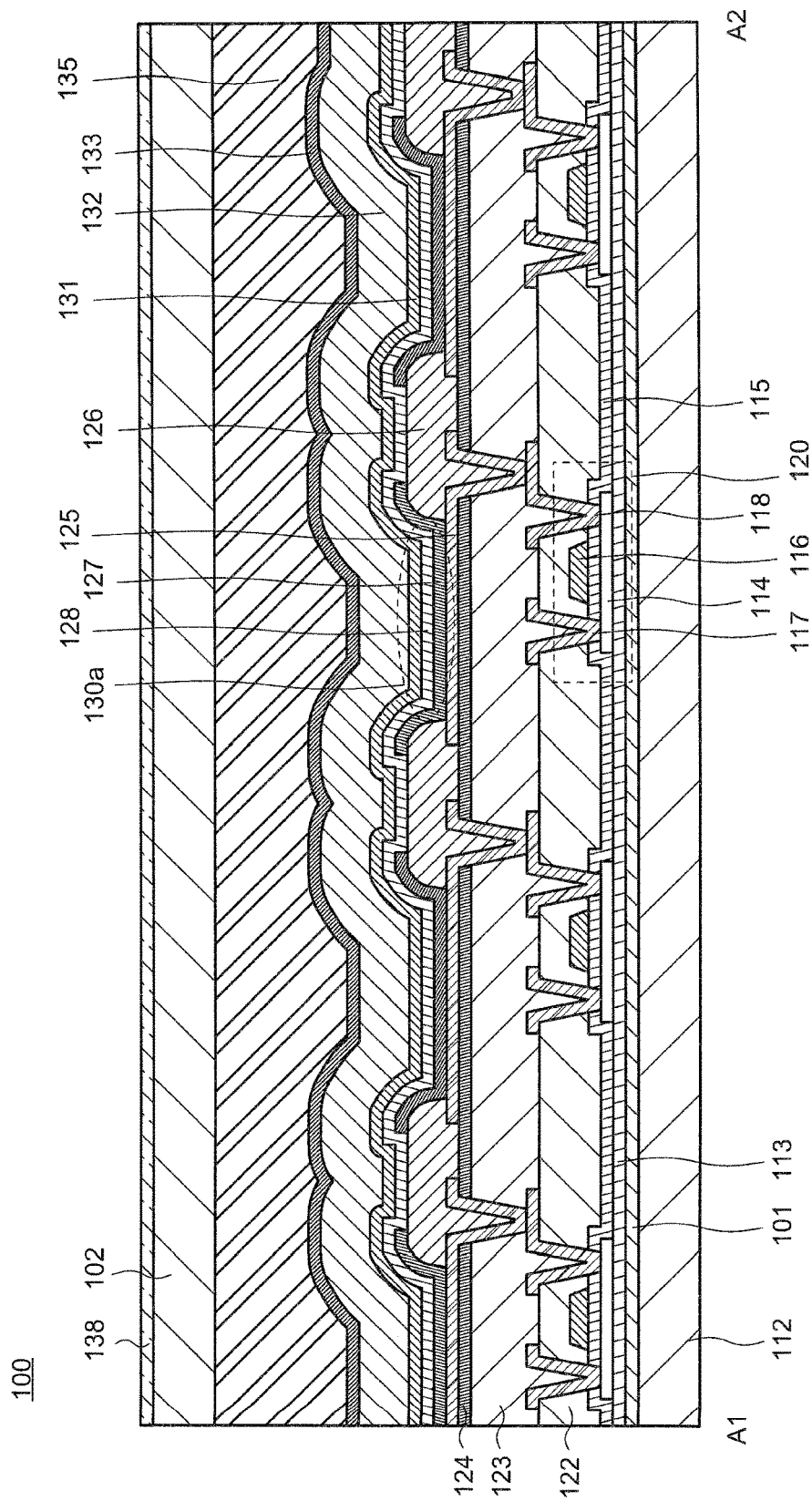
FIG. 10 is a cross-sectional view of a display region shown in FIG. 9 taken along line A1-A2 in FIG. 9.
Figure 11:
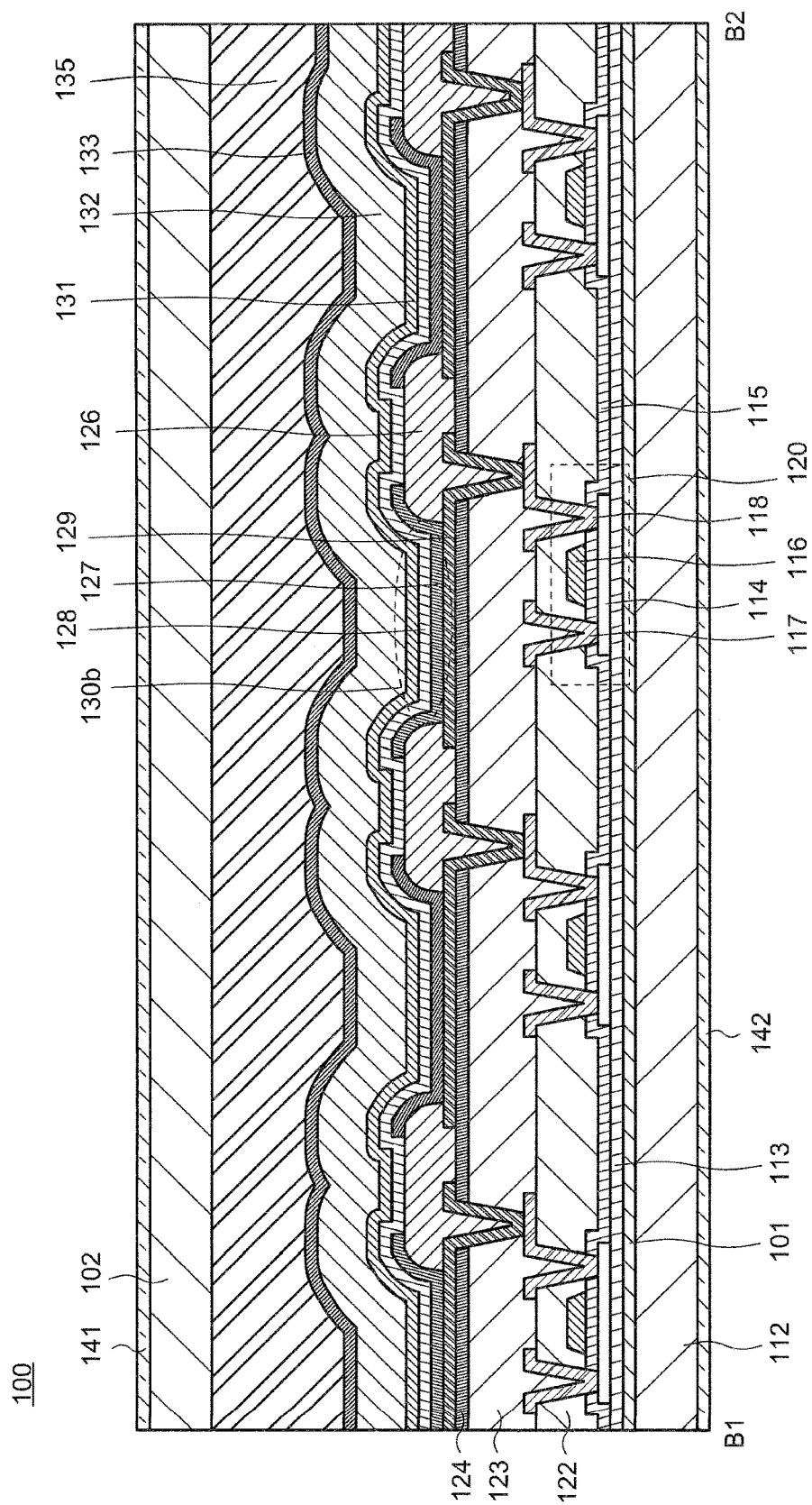
FIG. 11 is a cross-sectional view of a display region shown in FIG. 9 taken along line B1-B2 in FIG. 9.

Now, a structure of the pixels 109a included in the display region 103a shown in FIG. 9 and a structure of the pixels 109b included in the display region 103b shown in FIG. 9 will be described with reference to FIG. 10 and FIG. 11. Specifically, FIG. 10 shows a cross-sectional structure of the display region 103a shown in FIG. 9 taken along line A1-A2. FIG. 11 shows a cross-sectional structure of the display region 103b shown in FIG. 9 taken along line B1-B2.

FIG. 10 shows the cross-sectional structure of a portion of the pixels 109a included in the display region 103a. Referring to FIG. 10, generally, one pixel 109a will be described. The substrate 101, a substrate 112 and a counter substrate 102 may each be a glass substrate, a quartz substrate or a flexible substrate (flexible resin substrate formed of polyimide, polyethyleneterephthalate, polyethylenenaphthalate, triacetylcellulose, cyclic olefin copolymer, cycloolefin polymer or the like). In this embodiment, the substrate 101 and the substrate 112 are each a flexible substrate such that the display panel 100 is foldable. The substrate 112 is provided opposite to the substrate 101. It is preferred that the substrate 101 and the substrate 112 are light-transmissive and transparent with no color.

An underlying layer film 113 is provided on the substrate 101. The underlying film 113 is an insulating layer formed of an inorganic material such as silicon oxide, silicon nitride, aluminum oxide or the like. The underlying film 113 is not limited to being a single-layer film, and but alternatively, may have a stack structure including, for example, a silicon oxide layer and a silicon nitride layer. The structure of the underlying film 113 may be appropriately determined in consideration of the adhesiveness with the substrate 101 and the gas barrier property for the transistor (described below; represented by reference sign 120 in FIG. 10 and FIG. 11).

The transistor 120 is provided on the underlying film 113. The transistor 120 may be of a top gate type or a bottom gate type. In this embodiment, the transistor 120 each include a semiconductor layer 114 provided on the underlying film 113, a gate insulating film 115 covering the semiconductor layer 114, and a gate electrode 116 provided on the gate insulating film 115. The gate electrode 116 is covered with an interlayer insulating layer 122. A source or drain electrodes 117 and a source or drain electrode 118 are provided on the interlayer insulating layer 122 and each connected with the semiconductor layer 114. Either one of the source electrode and the drain electrode is represented by reference sign 117, and the other of the source electrode and the drain electrode is represented by reference sign 118. In this embodiment, the interlayer insulating layer 122 has a single-layer structure, but alternatively, may have a stack structure.

The components of the transistor 120 may each be formed of a known material. There is no specific limitation on the materials of the components of the transistor 120. For example, the semiconductor layer 114 is generally formed of polycrystalline silicon, amorphous silicon or an oxide semiconductor. The gate insulating film 115 may be formed of silicon oxide or silicon nitride. The gate electrode 116 is formed of a metal material such as copper, molybdenum, tantalum, tungsten, aluminum or the like. The interlayer insulating layer 122 may be formed of silicon oxide or silicon nitride. The source and drain electrodes 117 and 118 are each formed of a metal material such as copper, titanium, molybdenum, aluminum or the like.

Although not shown in FIG. 10, a first wire formed of the same metal material as that of the gate electrode 116 may be contained in the layer containing the gate electrode 116. The first wire may be provided as, for example, a scanning line or the like driven by the scanning line driving circuit 104. Although not shown in FIG. 10, a second wire formed extending in a direction crossing the first wire may be provided in the layer containing the source and drain electrodes 117 and 118. The second wire may be provided as, for example, a data line or the like driven by the data line driving circuit 105.

A flattening film 123 is provided on the transistor 120. The flattening film 123 contains an organic resin material. The organic resin material may be, for example, a known organic resin material such as polyimide, polyamide, acrylic resin, epoxy or the like. These materials are usable to form a film by a solution coating method, and have a characteristic of providing a high flattening effect. The flattening film 123 is not limited to having a single-layer structure, but alternatively, may have a stack structure including a layer containing an organic resin material and a layer containing an inorganic resin material, although such a stack structure is not shown.

The flattening film 123 has a contact hole exposing a part of the source or drain electrode 118. This contact hole is an opening usable to electrically connecting a pixel electrode 125 (described below) and the source or drain electrode 118 to each other. Therefore, the contact hole is provided to reach the part of the source or drain electrode 118. The source or drain electrode 118 is exposed at the bottom of the contact hole.

A protective film 124 is provided on the flattening film 123. The contact hole formed in the flattening film 123 is also formed in the protective film 124. It is preferred that the protective film 124 has a barrier function against moisture and oxygen. The protective film 124 is formed of an inorganic insulating material such as silicon nitride, aluminum oxide or the like.

The pixel electrode 125 is provided on the protective film 124. The pixel electrode 125 is also provided in the contact hole formed in the flattening film 123 and the protective film 124. Thus, the pixel electrode 125 is electrically connected with the source or drain electrode 118 exposed at the bottom of the contact hole. In the display region 103a shown in FIG. 10, the pixel electrode 125 acts as an anode of a light emitting element 130a. The structure of the pixel electrode 125 varies in accordance with whether the display panel 100 is of a top emission type or a bottom emission type. In the case where the display panel 100 is of the top emission type, the pixel electrode 125 is formed of a metal layer having a high light reflectance or has a stack structure including a transparent conductive layer, having a high work function such as an indium oxide-based transparent conductive layer (e.g., ITO), a zinc oxide-based transparent conductive layer (e.g., IZO, ZnO) or the like, and a metal layer. In the case where the display panel 100 is of the bottom emission type, the pixel electrode 125 is formed of any of the above-described transparent conductive layers. In this embodiment, the display device (organic EL display device) including the display panel 100 is of the top emission type. The pixel electrode 125 has a stack structure including a transparent conductive layer, a metal layer having a high light reflectance and a transparent conductive layer.

A first insulating layer 126 formed of an organic resin material is provided on the pixel electrode 125. The organic resin material may be a known resin material such as a polyimide-based resin material, a polyamide-based resin material, an acrylic resin-based material, an epoxy-based resin material, a siloxane-based resin material or the like. The first insulating layer 126 has an opening above a part of the pixel electrode 125. The first insulating layer 126 is provided between two adjacent pixel electrodes 125 so as to cover edges of the pixel electrodes 125, and acts as a member isolating the two adjacent pixel electrodes 125 from each other. Therefore, generally, the first insulating layer 126 is also called a "partition wall" or a "bank". The part of the pixel electrode 125 exposed by the first insulating layer 126 is a light emitting region of the light emitting element 130a. It is preferred that the opening in the first insulating layer 126 has a tapering inner wall. Such a shape of the opening decreases coverage insufficiency at the edges of the pixel electrodes 125 during the formation of a light emitting layer (described below). The first insulating layer 126 may act as a filler that fills the contact hole, namely, a recessed portion formed in the flattening film 123 and the protective film 124, in addition to having a function of covering the edges of the pixel electrodes 125.

An organic layer 127 is provided on the pixel electrode 125. The organic layer 127 includes at least the light emitting layer formed of an organic material, and acts as the light emitting portion of the light emitting element 130a. The organic layer 127 may include, in addition to the light emitting layer, functional layers such as a hole injection layer and/or a hole transfer layer, an electron injection layer and/or an electron transfer layer, or the like. The light emitting layer is provided so as to cover the light emitting region, more specifically, the opening in the first insulating layer 126.

In this embodiment, the light emitting layer included in the organic layer 127 emits light of a desired color. The organic layers 127 provided on different pixel electrodes 125 include light emitting layers that emit light of different colors. Thus, the RGB colors are displayed. Namely, in this embodiment, the light emitting layers in the organic layer 127 are discontinuous between adjacent pixel electrodes 125. The hole injection layer and/or the hole transfer layer, and the electron injection layer and/or the electron transfer layer, are continuous over adjacent pixel electrodes 125. The organic layer 127 may have a known structure and may be formed of a known material. The structure and the material of the organic layer 127 are not limited to those described in this embodiment. The organic layer 127 may include a light emitting layer that emits white light, so that the display panel 100 displays the RGB colors by use of color filters. In this case, the organic layer 127 may be provided on the first insulating layer 126.

A counter electrode 128 is provided on the organic layer 127 and the first insulating layer 126. The counter electrode 128 acts as a cathode of the light emitting element 130a. Since the display panel 100 in this embodiment is of the top emission type, the counter electrode 128 is formed of a thin film of a light-transmissive material. A thin film usable to form such a light-transmissive electrode may be formed of MgAg or a transparent conductive material (ITO or IZO). The counter electrode 128 is provided also on the first insulating layer 126 across the adjacent pixels 109. In a peripheral region in the vicinity of an edge of the display region 103a, the counter electrode 128 is electrically connected with an external terminal via the conductive layer below the counter electrode 128. As described above, in this embodiment, the light emitting element 130a includes the part of the pixel electrode 125 exposed from the first insulating layer 126 (anode), the organic layer (light emitting portion) and the counter electrode 128 (cathode).

As shown in FIG. 10, a first inorganic insulating layer 131, an organic insulating layer 132 and a second inorganic insulating layer 133 are provided in the display region 103a. The first inorganic insulating layer 131, the organic insulating layer 132 and the second inorganic insulating layer 133 act as a sealing film that prevents entrance of moisture or oxygen into the light emitting element 130a. Provision of the sealing film on the display region 103a prevents entrance of water or oxygen into the light emitting element 130a, and thus improves the reliability of the display device. The first inorganic insulating layer 131 and the second inorganic insulating layer 133 may be formed of, for example, silicon nitride ($Si_xN_y$), silicon oxide nitride ($SiO_xN_y$), silicon nitride oxide ($SiN_xO_y$), aluminum oxide ($Al_xO_y$), aluminum nitride ($Al_xN_y$), aluminum oxide nitride ($Al_xO_yN_z$), aluminum nitride oxide ($Al_xN_yO_z$) or the like (x, y and z are arbitrary numerals). The organic insulating layer 132 may be formed of polyimide resin, acrylic resin, epoxy resin, silicone resin, fluorine resin, siloxane resin or the like.

In this embodiment, an assembly of the above-described components from the substrate 112 to the sealing film is referred to as an "array substrate".

A viscous member 135 is provided on the second inorganic layer 133. The viscous member 135 may be formed of a viscous material such as an acrylic material, a rubber-based material, a silicone-based material or a urethane-based material. The viscous member 135 may contain a water-absorbing substance such as calcium, zeolite or the like. Even if moisture enters the inside of the display panel 100, such a water-absorbing substance contained in the viscous member 135 delays the moisture reaching the light emitting element 130a. A spacer may be provided in the viscous member 135 in order to guarantee a certain distance between the substrate 101 and the counter substrate 102. Such a spacer may be contained in the viscous member 135, or may be formed on the substrate 101 of a resin or the like.

The counter substrate 102 may be covered with, for example, an overcoat layer also acting as a flattening layer. In the case where the organic layer 127 emits white light, the counter substrate 102 may be provided, on a main surface thereof (surface facing the substrate 101), with color filters corresponding to the RGB colors and a black matrix located between the color filters. In the case where no color filter is formed on the counter substrate 102, the color filters may be formed directly on, for example, the sealing film, and the viscous member 135 may be formed on the color filters. A polarization plate 138 is provided on a rear surface (surface on the display screen side) of the counter substrate 102. The polarization plate 138 is preferably a circular polarization plate.

FIG. 11 shows the cross-sectional structure of a portion of the pixels 109b included in the display region 103b. Referring to FIG. 11, generally, one pixel 109b will be described. The pixel 109b shown in FIG. 11 has a partially different structure from that of the pixel 109a shown in FIG. 10. Specifically, the structure of the light emitting element 103b included in the pixel 109b is partially different from the structure of the light emitting element 103a shown in FIG. 10. The other components are substantially the same as those in FIG. 10, and will not be described in detail.

The light emitting element 103b shown in FIG. 11 includes a pixel electrode 129, the organic layer 127 including a light emitting layer, and the counter electrode 128. The pixel electrode 129 includes only a transparent conductive layer and does not include a metal layer having a high light reflectance. The counter electrode 128 is formed of the same transparent conductive layer as that of the light emitting element 130a shown in FIG. 10. With such an arrangement, display in the display region 103b is visually recognizable in the first direction in the state where the display panel 100 is extended out from the housing. In the state where the display panel 100 is accommodated in the housing, the display in the display region 103b is visually recognizable in the second direction opposite to the first direction. In the case where the plurality of pixels 109b in the display region 103b are all in a non-lit state, the display region 103b is transparent.

In the example shown in FIG. 9, the light emitting element 130a including the pixel electrode 125 having a function of reflecting light is included in the display region 103a, and the light emitting element 130b including the pixel electrode 129 having a function of transmitting light is included in the display region 103b. The present invention is not limited to such a structure. The display region 103b may include the light emitting element 130a in addition to the light emitting element 130b.

A polarization plate 141 is provided above the display region 103b, and a second polarization plate 142 is provided below the display region 103b. The polarization plate 141 and the polarization plate 142 are provided in a crossed-Nicols state. Provision of the polarization plate 141 and the polarization plate 142 improves the image quality in the display region 103b.

Although not shown in FIG. 10, a touch panel may be provided in the display region 103a. In the display region 103b, a touch panel may be provided on the substrate 101. With such a structure, even in the state where the display device is folded, the display in the display region 103b may be checked and the touch panel on the substrate 101 in the display region 103b may be operated. In the case where the polarization plate is provided in the display region 103a and the display region 103b, the touch panel is provided with the polarization plate being located between the touch panel and the display regions 103a and 103b.

In this embodiment, the display region 103a and the display region 103b in the display region may be produced at the same time. For example, in the display region 103a and the display region 103b shown in FIG. 10 and FIG. 11, the components up to the protective film 124 may be formed at the same time. The pixel electrode 125 and 129 are formed as follows. First, a transparent conductive layer is formed in the display region 103a and the display region 103b. Next, a metal layer having a high light reflectance is formed only in the display region 103a. Next, a transparent conductive layer is formed in the display region 103a and the display region 103b. Then, the layers are patterned to form the pixel electrode 125 in the display region 103a and the pixel electrode 129 in the display region 103b. In this manner, the pixel electrode 125, which is light-reflective, and the pixel electrode 129, which is light-transmissive, are formed with no addition of any complicated production step. After this, the step of forming the organic layer 127 including the light emitting layer and the other steps may be performed in the display region 103a and the display region 103b.

The devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in a condition optionally by a person of ordinary skill in the art. Such devices and methods are encompassed in the scope of the present invention as long as including the gist of the present invention. The above-described embodiments may be combined in any way unless any technological contradictions occur.

Even functions and effects that are different from those provided by the above-described embodiments but are obvious from the description of this specification or are easily expectable by a person of ordinary skill in the art are naturally construed as being provided by the present invention.

What is claimed is:

1. A display device, comprising:
    a display panel including a first display region and a second display region, the display panel being flexible; and
    a housing capable of accommodating the display panel, wherein
    display in the first display region and display in the second display region are visually recognizable in a first direction in a state where the display panel is taken out from the housing, and
    the display in the second display region is visually recognizable in a second direction opposite to the first direction in a state where the display panel is accommodated in the housing,
    wherein
    the first display region includes a first light emitting element,
    the first light emitting element includes a light-reflective pixel electrode, a first organic layer and a light-transmissive counter electrode,
    the second display region includes a second light emitting element, and
    the second light emitting element includes a light-transmissive pixel electrode, a second organic layer and the light-transmissive counter electrode.

2. The display device according to claim 1, further comprising:
    a first polarization plate provided above the second display region, and
    a second polarization plate provided below the second display region,
    wherein the first polarization plate and the second polarization plate are provided in a crossed-Nicols state.

3. The display device according to claim 1, further comprising a third polarization plate provided above the first display region.

4. The display device according to claim 1, further comprising a touch panel provided below the second display region.

5. The display device according to claim 1, further comprising a touch panel provided above the first display region and the second display region.

6. A display device, comprising:
    a display panel including a first display region and a second display region, the display panel being flexible; and
    a cylindrical housing capable of accommodating the display panel,
    wherein
    the cylindrical housing has an opening, and
    display in the second display region is visually recognizable through the opening in a state where the display panel is accommodated in the cylindrical housing.

7. The display device according to claim 6, further comprising:
    a first polarization plate provided above the second display region, and
    a second polarization plate provided below the second display region,
    wherein the first polarization plate and the second polarization plate are provided in a crossed-Nicols state.

8. The display device according to claim 6, further comprising a third polarization plate provided above the first display region.

9. The display device according to claim 6, further comprising a touch panel provided below the second display region.

10. The display device according to claim 6, further comprising a touch panel provided above the first display region and the second display region.

11. The display device according to claim 6, wherein
    the first display region includes a first light emitting element,
    the first light emitting element includes a light-reflective pixel electrode, a first organic layer and a light-transmissive counter electrode,
    the second display region includes a second light emitting element, and
    the second light emitting element includes a light-transmissive pixel electrode, a second organic layer and the light-transmissive counter electrode.

12. A display device, comprising:
    a display panel including a first display region and a second display region, the display panel being flexible; and
    a foldable housing accommodating the display panel,
    wherein
    the housing has an opening, and display in the second display region is visually recognizable through the opening in a state where the housing is folded, wherein the first display region includes a first light emitting element, the first light emitting element includes a light-reflective pixel electrode, a first organic layer and a light-transmissive counter electrode, the second display region includes a second light emitting element, and the second light emitting element includes a light-transmissive pixel electrode, a second organic layer and the light-transmissive counter electrode.

13. The display device according to claim 12, further comprising:

a first polarization plate provided above the second display region, and a second polarization plate provided below the second display region, wherein the first polarization plate and the second polarization plate are provided in a crossed-Nicols state.

14. The display device according to claim 12, further comprising a third polarization plate provided above the first display region.

15. The display device according to claim 12, further comprising a touch panel provided below the second display region.

16. The display device according to claim 12, further comprising a touch panel provided above the first display region and the second display region.

* * * * *